United States Patent [19]

Pezzani

[11] Patent Number: 5,699,008
[45] Date of Patent: Dec. 16, 1997

[54] THYRISTOR CONTROLLABLE BY LOGIC SIGNALS

[75] Inventor: Robert Pezzani, Vouvray, France

[73] Assignee: SGS-Thomson Microelectronics S.A., Saint Genis, France

[21] Appl. No.: 549,000

[22] Filed: Oct. 27, 1995

[30] Foreign Application Priority Data

Oct. 28, 1994 [FR] France .................. 94 13147

[51] Int. Cl.$^6$ ................................. H03K 17/72
[52] U.S. Cl. ..................... 327/438; 327/440; 327/533
[58] Field of Search .................... 327/438, 465, 327/439, 470, 440, 533, 447, 582, 448

[56] References Cited

U.S. PATENT DOCUMENTS

| | | | |
|---|---|---|---|
| 3,781,631 | 12/1973 | Nelson et al. | 320/25 |
| 3,781,632 | 12/1973 | Charboneau | 327/465 |
| 3,967,138 | 6/1976 | Mitsuoka et al. | 327/465 |
| 3,979,766 | 9/1976 | Tsuyuki | 357/37 |
| 4,160,920 | 7/1979 | Courier de Mere | 327/470 |
| 4,286,280 | 8/1981 | Sugawara | 357/50 |
| 4,949,147 | 8/1990 | Bacuvier | 357/38 |
| 5,365,086 | 11/1994 | Pezzani | 257/157 |
| 5,410,238 | 4/1995 | Ishizuka et al. | 320/22 |

FOREIGN PATENT DOCUMENTS

| | | | |
|---|---|---|---|
| A-38 10 536 | 10/1988 | Germany | H03K 17/72 |
| A-2 069 255 | 9/1991 | United Kingdom | H03K 17/72 |

OTHER PUBLICATIONS

Patent Abstracts of Japan, vol. 6, No. 155 (E–125) Aug. 17, 1982 & JP-A-57 075 599 (Nippon Denso Co. Ltd.).

Primary Examiner—Timothy P. Callahan
Assistant Examiner—Jeffrey Zweizig
Attorney, Agent, or Firm—Wolf, Greenfield & Sacks, P.C.; James H. Morris

[57] ABSTRACT

A thyristor, controllable by logic signals independent of its cathode voltage, includes a thyristor, a PNP transistor between the gate and the anode of the thyristor, and an NPN transistor between the base of the PNP transistor and a terminal connected to ground through a resistor, the base of the NPN transistor receiving the logic signals.

43 Claims, 2 Drawing Sheets

THYRISTOR CONTROLLABLE BY LOGIC SIGNALS

BACKGROUND OF THE INVENTION

1. Field of the Invention

The present invention relates to a thyristor to be directly controlled through logic signals provided by a microcontroller and incorporating a circuit for translating the gate voltage level. The invention more particularly applies to regulated battery charging circuits in which regulation is carried out at the secondary of a transformer.

2. Discussion of the Related Art

The invention applies to configurations in which a circuit for charging a battery is incorporated between the secondary terminals of a transformer and a battery charging terminal, the other terminal of the battery being connected to ground. Such circuits are known in the art. They generally include a switched power switch to provide a constant mean current to the battery. They also include an integrated control circuit or microcontroller, for example the circuit marketed under reference ST62 by SGS-Thomson, and a voltage regulation integrated circuit adapted to provide a regulated power supply with a determined value, for example +5 volts, more particularly for the control circuit. The microcontroller receives information relating to the current in the battery, for example by detecting the voltage across a resistor connected in series with the battery.

In practice, such circuits for charging batteries include two integrated circuits, the microcontroller and the voltage regulation circuit, and a plurality of discrete components corresponding more particularly to one or several power switches, circuits for adjusting the control signal and rectifiers to be connected to the power switch and to the supply terminal of the voltage regulation circuit.

The present invention more particularly relates to the case when the power switches are of the thyristor-type. One problem with existing thyristor circuits is that the set of discrete components associated with the thyristors and with the rectifying function cannot be fabricated as a monolithic component.

SUMMARY OF THE INVENTION

An object of the present invention is to provide a monolithic component including a thyristor and a control circuit controlled by logic signals.

Another object of the present invention is to provide such a monolithic component that also incorporates rectifying elements.

A further object of the present invention is to provide a switching circuit for charging a battery comprising only three elements: a first component grouping all the power functions, a second component constituting a microcontroller known per se, and a third component constituting a voltage regulation circuit known per se.

To achieve these objects, the applicant has developed a new thyristor configuration, a new configuration of a circuit for charging batteries and a monolithic component incorporating all the power components of this circuit.

More particularly, the present invention provides a thyristor controllable by logic signals independent of its cathode voltage, comprising a thyristor, a PNP transistor disposed between the gate and the anode of the thyristor, and an NPN transistor between the base of the PNP transistor and a terminal connected to ground through a resistor, the base of the NPN transistor receiving the logic signals.

The present invention also provides a switching circuit for charging batteries, which is disposed at the secondary of a transformer to charge a battery according to conditions set by a switching control integrated circuit, comprising the above thyristor and rectifying diodes, the rectifying diodes being connected between the terminals of the secondary of the transformer and the anode of the thyristor.

This circuit can also include a terminal adapted to supply a circuit providing a regulated voltage, and a diode that is connected between the common node of the first and second diodes and the terminal.

According to an embodiment of the invention, the above thyristor comprises, in a low doped substrate of a first conductivity type, a well-type thyristor comprising, on the rear surface of the substrate, a first region of the second conductivity type, an isolation wall of the second conductivity type extending from the upper surface of the substrate to the periphery of the first region, on the upper surface of the substrate, a second region of the second conductivity type and a third region of the first conductivity type that is formed in the second region; in a portion of the substrate region, delineated by the isolation wall, a fourth region of the second conductivity type and, in the fourth region, a fifth region of the first conductivity type; and first, second, third, and fourth metallizations in contact with the rear surface of the substrate, the third region, the fourth region and the fifth region, respectively.

The present invention also provides a switching circuit for charging batteries that is disposed at the secondary of a transformer to charge a battery according to conditions set by a switching control integrated circuit, comprising first and second thyristors such as those above mentioned between each transformer terminal and a supply terminal of the battery, and rectifying diodes between each transformer terminal and a common supply terminal.

According to an embodiment of the invention, the above thyristor comprises, in a low doped substrate of a first conductivity type, a first layer of the second conductivity type, on the rear surface of the substrate, an isolation wall of the second conductivity type extending from the upper surface of the substrate to the periphery of the first layer, on the upper surface of the substrate, second regions and third regions of the second conductivity type, fourth regions of the first conductivity type formed in the third regions, a fifth region of the first conductivity type formed on the rear surface of the substrate, first metallizations contacting each second region, a second metallization contacting the third regions, a third metallization contacting the fourth regions, and a fourth metallization contacting the rear surface.

The foregoing and other objects, features, aspects and advantages of the invention will become apparent from the following detailed description of the present invention when taken in conjunction with the accompanying drawings.

DETAILED DESCRIPTION

Figure 1:
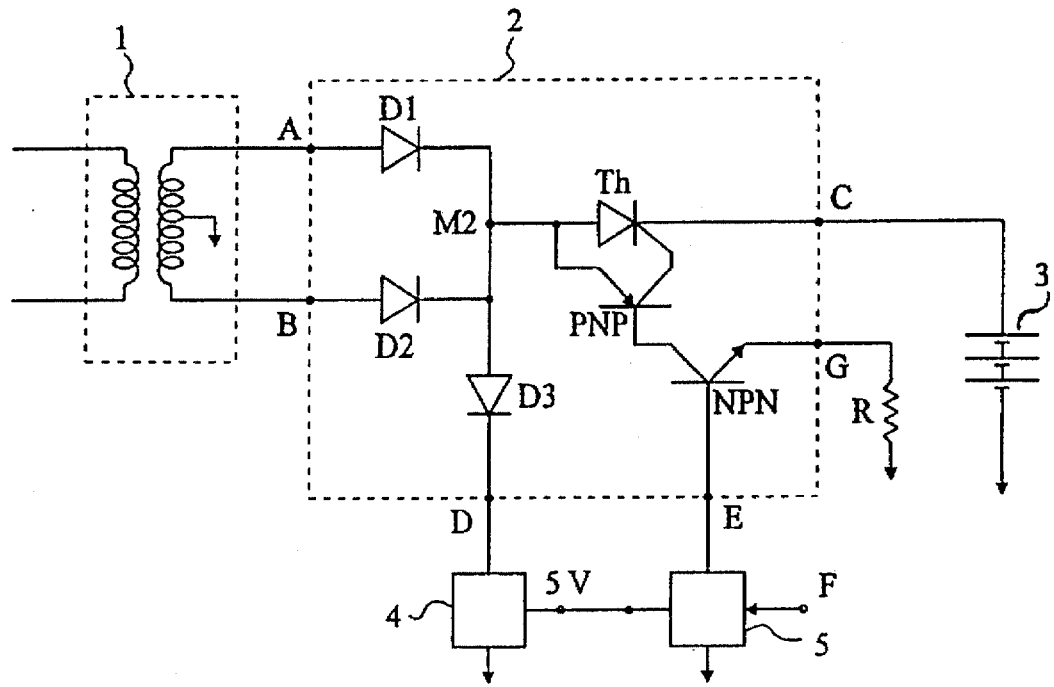
FIG. 1 illustrates a switching circuit for charging batteries according to the invention.

As illustrated in FIG. 1, a switching circuit for charging batteries, connected to the secondary of a transformer 1 having a center tap connected to ground, includes a power circuit 2 having various components, a battery 3 to be charged, a circuit 4 for supplying a regulated voltage, and a microcontroller 5.

The power circuit 2 comprises input terminals A and B that are connected to the secondary of transformer 1, a terminal C for charging a battery 3, a terminal D for supplying with a d.c. voltage the circuit 4 providing a regulated voltage, and a terminal E for receiving the control signal provided by circuit 5.

Many implementations of the circuit 4 and of the microcontroller 5 are known. Conventionally, the circuit 4 for supplying a regulated voltage provides a 5-volt regulated voltage that powers the microcontroller 5. The microcontroller 5, in addition to its supply input, comprises a regulation input F which corresponds, for example, to a voltage tap on a resistor in series with the battery 3. The microcontroller 5 provides at terminal E logic control signals that have a low voltage corresponding to the ground voltage and a high voltage of approximately 5 volts with respect to ground. These logic signals do not allow to direct control the gate of a thyristor whose cathode is not connected to ground, and which is, for example, at the high voltage of a battery. Hence, a level translation circuit should be provided.

The circuit 2 according to the invention comprises rectifying elements for providing the rectified voltage of the secondary of the transformer, both to the anode of a power switch, and to terminal D. In the represented embodiment, these rectifying elements comprise diodes D1, D2, D3. The anodes of diodes D1 and D2 are connected to the two terminals of the secondary of the transformer, and the cathodes of diodes D1 and D2 are connected to the anode of a thyristor Th and to the anode of diode DS. Diode D3 is designed to prevent a reverse voltage from terminal D from being applied to the anode of thyristor Th when a low voltage appears at the secondary of the transformer.

The circuit for translating the level of the control signal from terminal E comprises a PNP transistor connected between the anode and the gate of thyristor Th and an NPN transistor connected between the base of the PNP transistor and a terminal G that is connected to ground through a current limiting resistor R. The control signals at terminal E are applied to the base of transistor NPN. Thus, in the presence of positive signals at terminal E, the NPN and PNP transistors are turned on, and the anode of thyristor Th is connected to its gate, which turns the thyristor on as soon as the voltage at its anode is sufficiently higher than the voltage at its cathode.

This level translation circuit and its integration process as a monolithic component constitute an aspect of the present invention.

Figure 2:
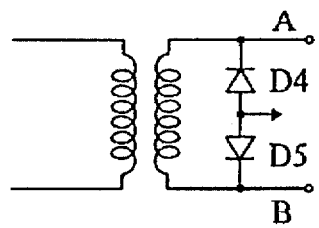
FIG. 2 illustrates an alternative embodiment of the transformer of FIG. 1.

FIG. 2 represents an alternative embodiment in which the transformer 1 does not comprise a center tap that can be connected to ground. In this case, terminals A and B are connected to ground through respective diodes D4 and D5 having their anodes connected to ground.

Figure 3:
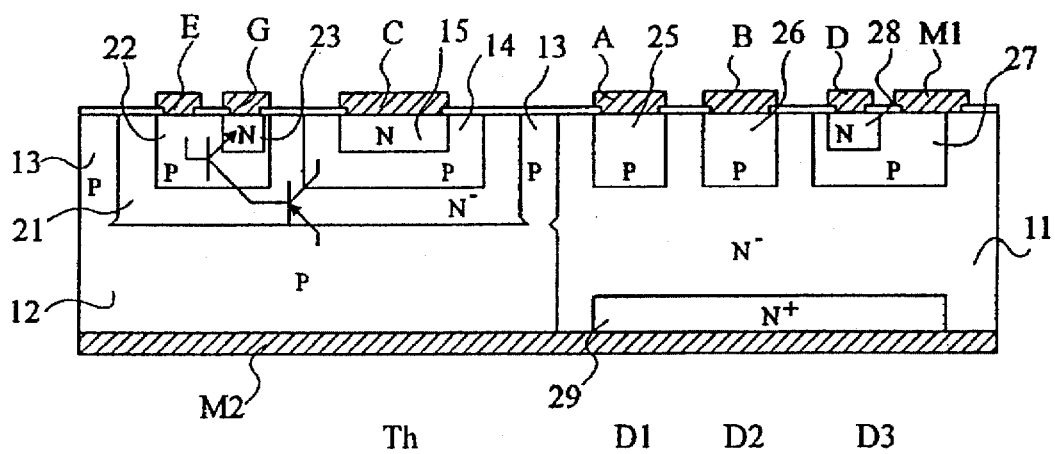
FIG. 3 is a schematic cross-sectional view of a monolithic component incorporating the power elements of the switching circuit for charging batteries according to the invention.

FIG. 3 is a schematic cross-sectional view of a semiconductor component incorporating the elements of the circuit 2 of FIG. 1. It will be clear to those skilled in the art that this schematic is not drawn to scale either in the vertical direction or in the horizontal direction. In particular, the surface areas of the various components will be selected as a function of the maximum currents that may flow therethrough. Selection of the doping levels and the depth of junctions is within the knowledge of those skilled in the art.

The component of FIG. 3 is fabricated from an N-type low doped single-crystal silicon substrate 11. The left portion of the drawing represents a well-type thyristor, i.e., a thyristor in which a P-type layer 12 is formed from the rear surface of the substrate and contacts at its periphery a P-type isolation wall 13 formed from the upper surface. This thyristor, which constitutes the thyristor Th of FIG. 1, comprises layer 12, corresponding to its anode, a portion 21 of the substrate and, on the upper surface, a first P-type region 14 in which is formed an N-type region 15 which constitutes the cathode.

A second P-type region 22, in which is formed an N-type region 23, is formed in the portion 21 of substrate 11, portion 21 being delineated by the isolation wall 13.

Region 22 is coated with a metallization E, region 23 is coated with a metallization G, region 15 is coated with a metallization C, and the rear surface of the substrate is coated with a metallization M2. These metallizations correspond to the terminals having the same reference characters as in FIG. 1. Metallization M2 corresponds to the anode of thyristor Th.

Thus, the thyristor Th comprising the layers 12-21-14-15 is disposed between terminals M2 and C, inside the well delineated by the isolation walls 13. The PNP transistor connected between the anode and gate of thyristor Th corresponds to a portion of this thyristor and more particularly to layers 12-21-14. The transistor NPN has an emitter that corresponds to region 23 connected to terminal G, a base that corresponds to region 22 connected to terminal E, and a collector that corresponds to layer 21, i.e., to the base region of the PNP transistor.

Three P-type regions 25, 26 and 27 are formed from the upper surface of the substrate, outside the region delineated by the isolation wall 13. A highly doped N-type region 29 is preferably formed from the rear surface of substrate 11, beneath regions 25, 26 and 27.

Region 25 is coated with a metallization A, region 26 is coated with a metallization B, region 28 is coated with a metallization D, region 27 is coated with a metallization M1 which short-circuits region 27 with a preferably overdoped portion of the upper surface of substrate 11. These metallizations correspond to the terminals having the same reference characters as in FIG. 1. Thus, one obtains:

between metallizations A and M2, a vertical diode 25-11-29 corresponding to diode D1, between metallizations B and M2, a vertical diode 26-11-29 corresponding to diode D2, between metallizations D and M1, a lateral diode constituted by the junction between regions 28 and 27, and corresponding to diode D3. The anode of diode D3, which corresponds to metallization M1, is connected to metallization M2 through the conductive path extending through substrate 11 and layer 29. It should be noted that the series resistance of diode D3 is higher than the resistance of diodes D1 and D2 but this is not a problem because diode D3 is not designed to conduct a high current like diodes D1 and D2 but is only used to supply the circuit 4 with a regulated voltage.

Thus, the circuit of FIG. 1 is monolithically obtained.

Figure 4:
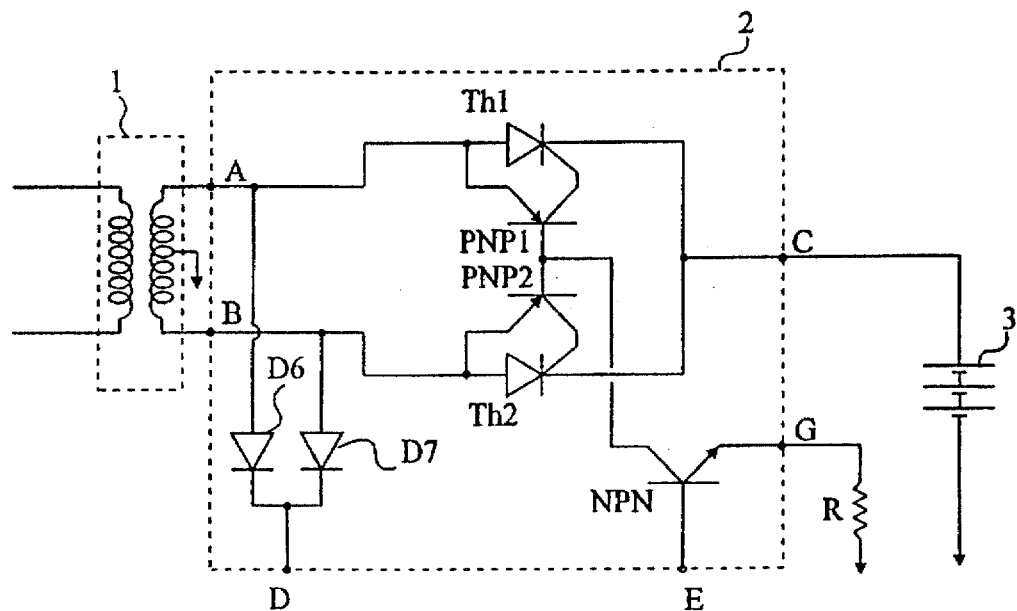
FIG. 4 represents an alternative embodiment of the switching circuit for charging batteries according to the invention.

FIG. 4 represents an alternative embodiment of the charging circuit 2 illustrated in FIG. 1.

In this alternative embodiment, a first thyristor Th1 is disposed between terminals A and C, and a second thyristor Th2 is disposed between terminals B and C. Diodes D6 and D7 are connected between each terminal A and B and terminal D. A transistor PNP1, PNP2 is associated with each thyristor Th1 and Th2 in the same way as the PNP transistor is associated with the thyristor Th in FIG. 1. An NPN transistor is connected between the common bases of transistors PNP1 and PNP2 and terminal G. The base of the NPN transistor is connected to terminal E. Thus, a circuit identical to the circuit illustrated in FIG. 1 is associated with each thyristor Th1 and Th2 for translating the level of the logic control signals applied to terminal E.

An advantage of the circuit in FIG. 4 over the circuit of FIG. 1 is that power losses are reduced because the battery is charged only through a thyristor, whereas, in the case of the circuit in FIG. 1, charging is provided by the series connection of a diode and a thyristor.

As will be seen hereinafter with relation to FIGS. 5A and 5B, the circuit of FIG. 4 can be integrated in a simple way.

Figure 5A:
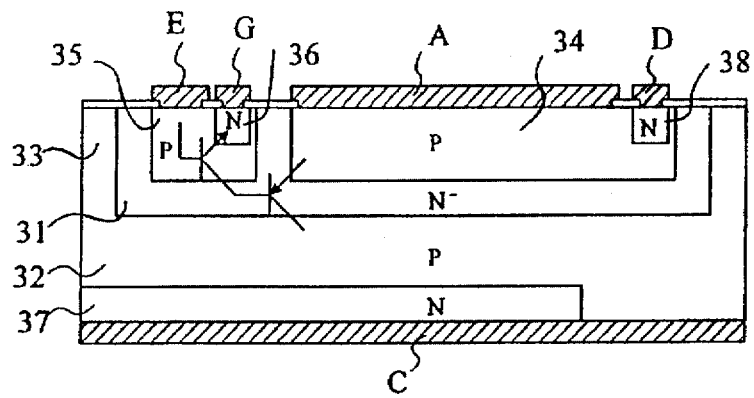
FIGS. 5A and 5B are a schematic cross-sectional view and a top view, respectively, of a monolithic component incorporating the elements of the circuit of FIG. 4.

FIG. 5A is a schematic cross-sectional view of a component implementing all the elements included in circuit 2 of FIG. 4. This component is constituted from a low doped N-type substrate 31. A P layer 32 is formed from the rear surface of the substrate and a P-type peripheral ring 33 is formed from the upper surface. In addition, a first P-type region 34 and a second P-type region 35 are formed from the upper surface. An N-type region 36 is formed in region 35. Regions 34, 35, 36 are respectively coated with metallizations A, E, and G. An N-type region 37 is formed beneath the whole region 35 and the largest part of region 34 from the rear surface.

Thus, one obtains a structure comprising, like the structure of the left portion of FIG. 3, a thyristor, a PNP transistor connected between the anode and gate of the thyristor and an NPN transistor that is connected between the base of the PNP transistor and an external terminal. The thyristor is constituted by regions 34, 31, 32 and 37, region 34 corresponding to its anode and region 37 corresponding to its cathode. The PNP transistor corresponds to regions 34, 31 and 32, region 34 corresponding to its emitter. The NPN transistor corresponds to regions 36, 35 and 31, region 36 corresponding to its emitter. This structure thus corresponds to a thyristor associated with a voltage translation circuit. Indeed, if a voltage referenced to ground is applied to terminal E, it causes the PNP transistor to turn on and, as a consequence, the thyristor to trigger. In FIG. 5A, it should be noted that, with respect to FIG. 3, the rear surface is coated with a metallization C which constitutes the cathode of the thyristor and is connected to terminal C whereas, in FIG. 3, the rear surface metallization M2 was not connected to an external terminal.

In addition, the present invention includes in the thyristor anode region 34 an N-type region 38 connected to a metallization D, the diode D6 (or D7) being constituted by the junction between regions 34 and 38.

Figure 5B:
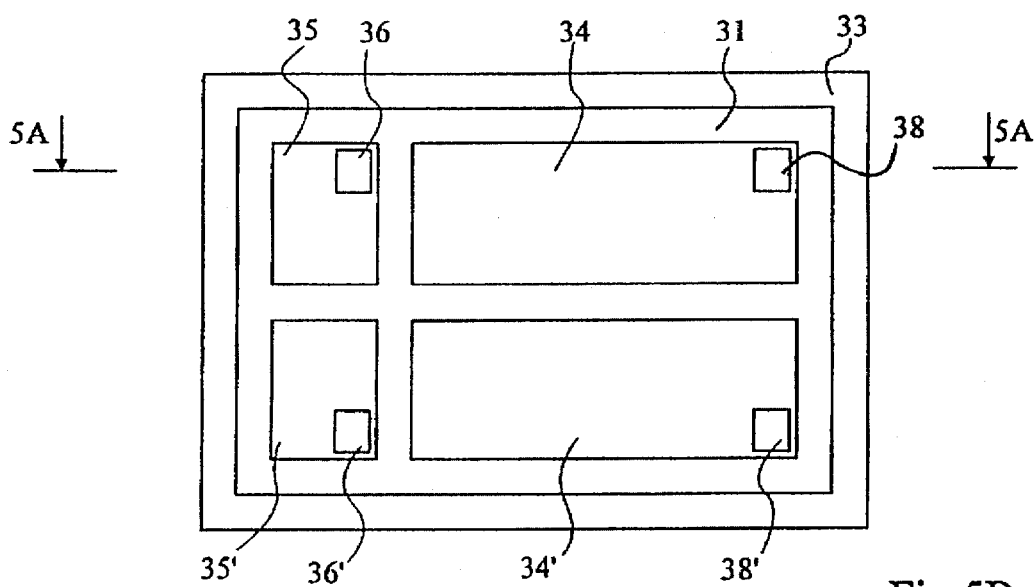

FIG. 5A is a cross-sectional view along line A—A of FIG. 5B. In FIG. 5B, the same reference characters as in FIG. 5A designate the same regions. Primed reference characters designate the elements of the second half of the structure. In FIG. 5B, the metallizations are not represented for the sake of simplification. Region 34' contacts terminal B, region 35' like region 35 is connected to terminal E, region 36' like region 36 is connected to terminal G, and region 38' like region 38 is connected to terminal D.

As is apparent to those skilled in the art, various modifications can be made to the above disclosed preferred embodiments for the fabrication of thyristors and diodes. In particular, when a transformer is used without a center tap, the component according to the invention can be connected to terminals A and B shown in FIG. 2.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A thyristor circuit, comprising:

a thyristor;

a PNP transistor between a gate and an anode of the thyristor; and an NPN transistor between a base of the PNP transistor and a terminal connected to ground through a resistor, a base of the NPN transistor receiving a logic signal that initiates conduction in the NPN transistor and enables conduction in the thyristor, the logic signal being referenced to a potential that is independent of a cathode voltage of the thyristor.

2. A switching circuit for charging batteries, disposed at a secondary of a transformer to charge a battery according to conditions set by a switching control integrated circuit, the switching circuit comprising:

a thyristor circuit that includes a thyristor, a PNP transistor between a gate and an anode of the thyristor, and an NPN transistor between a base of the PNP transistor and a terminal connected to ground through a resistor, a base of the NPN transistor receiving a logic signal that initiates conduction in the NPN transistor and enables conduction in the thyristor, the logic signal being referenced to a potential that is independent of a cathode voltage of the thyristor; and first and second rectifying diodes respectively connected between first and second terminals of the secondary of the transformer and the anode of the thyristor.

3. The switching circuit of claim 2, further comprising:

a third terminal adapted to feed a circuit providing a regulated voltage; and a diode connected between a common node of the first and second rectifying diodes and said third terminal.

4. The thyristor circuit of claim 1, wherein the thyristor is a well-type thyristor and the thyristor circuit is integrated in a low doped substrate of a first conductivity type, the thyristor circuit comprising:

on a rear surface of the substrate, a first region of a second conductivity type, an isolation wall of the second conductivity type extending from an upper surface of the substrate to a periphery of the first region;

on an upper surface of the substrate, a second region of the second conductivity type and a third region of the first conductivity type that is formed in the second region;

in a portion of the substrate delineated by the isolation wall, a fourth region of the second conductivity type and, in said fourth region, a fifth region of the first conductivity type; and first, second, third, and fourth metallizations contacting the rear surface of the substrate, the third region, the fourth region and the fifth region, respectively.

5. The switching circuit of claim 2, wherein the thyristor is a well-type thyristor and the switching circuit is a monolithic semiconductor component integrated in a low doped substrate of a first conductivity type, the switching circuit comprising:

on a rear surface of the substrate, a first region of a second conductivity type, an isolation wall of the second conductivity type extending from an upper surface of the substrate to a periphery of the first region;

on an upper surface of the substrate, a second region of the second conductivity type and a third region of the first conductivity type that is formed in the second region;

in a portion of the substrate delineated by the isolation wall, a fourth region of the second conductivity type and, in said fourth region, a fifth region of the first conductivity type;

first, second, third, and fourth metallizations contacting the rear surface of the substrate, the third region, the fourth region and the fifth region, respectively; and outside the portion delineated by the isolation wall:

a first vertical diode formed between a fifth metallization contacting a sixth region of the second conductivity type and the first metallization;

a second vertical diode formed between a sixth metallization contacting a seventh region of the second conductivity type and the first metallization;

a third lateral diode formed between a seventh metallization contacting an eighth region of the second conductivity type and the substrate and an eighth metallization contacting a ninth region of the first conductivity type that is formed in the eighth region.

6. A switching circuit disposed at a secondary of a transformer for charging batteries according to conditions fixed by a switching control integrated circuit, the switching circuit comprising:

a first thyristor circuit between a first transformer terminal of the secondary of the transformer and a battery supply terminal, the first thyristor circuit including a first thyristor and a first PNP transistor between a gate and an anode of the first thyristor;

a second thyristor circuit between a second transformer terminal of the secondary of the transformer and the battery supply terminal, the second thyristor circuit including a second thyristor and a second PNP transistor between a gate and an anode of the second thyristor, a base of the second PNP transistor being connected to a base of the first PNP transistor;

an NPN transistor between the bases of the first and second PNP transistors and a terminal connected to ground through a resistor, a base of the NPN transistor receiving a logic signal that initiates conduction in the NPN transistor and enables conduction in the first and second thyristors, the logic signal being referenced to a potential that is independent of a cathode voltage of the first and second thyristors;

a first rectifying diode between the first transformer terminal and a common supply terminal; and a second rectifying diode between the second transformer terminal and the common supply terminal.

7. The thyristor circuit of claim 1 integrated in a low doped substrate of a first conductivity type, the thyristor circuit comprising:

a first layer of a second conductivity type, on a rear surface of the substrate;

an isolation wall of the second conductivity type extending from an upper surface of the substrate to a periphery of the first layer;

on the upper surface of the substrate, second regions and third regions of the second conductivity type;

fourth regions of the first conductivity type respectively formed in each of the third regions;

a fifth region of the first conductivity type formed on the rear surface of the substrate;

first metallizations contacting each second region;

a second metallization contacting each third region;

a third metallization contacting the fourth regions; and a fourth metallization contacting the rear surface.

8. The switching circuit of claim 6 monolithically integrated in a low doped substrate of a first conductivity type, the switching circuit comprising:

a first layer of a second conductivity type, on a rear surface of the substrate;

an isolation wall of the second conductivity type extending from an upper surface of the substrate to a periphery of the first layer;

on the upper surface of the substrate, second regions and third regions of the second conductivity type;

fourth regions of the first conductivity type respectively formed in each of the third regions;

a fifth region of the first conductivity type formed on the rear surface of the substrate;

first metallizations contacting each second region;

a second metallization contacting each third region;

a third metallization contacting the fourth regions;

a fourth metallization contacting the rear surface; and in the second regions, sixth regions contacting a fifth metallization.

9. A thyristor circuit, comprising:

a first thyristor having a gate, an anode, and a cathode;

a first transistor having an emitter that is electrically coupled to the anode of the first thyristor, a collector that is electrically coupled to the gate of the first thyristor, and a base; and a second transistor having an emitter that is electrically coupled to a reference potential terminal, a collector that is electrically coupled to the base of the first transistor, and a base that receives a logic level control signal that initiates conduction in the second transistor to turn on the first thyristor when an anode voltage of the first thyristor is greater than a cathode voltage of the first thyristor.

10. The thyristor circuit of claim 9, further comprising:

a resistor, connected between the emitter of the second transistor and the reference potential terminal, that electrically couples the emitter of the second transistor to the reference potential terminal.

11. The thyristor circuit of claim 10, wherein the first transistor is a PNP transistor and the second transistor is an NPN transistor.

12. The thyristor circuit of claim 9, further comprising:

a first diode, electrically coupled to the anode of the first thyristor, that rectifies a first portion of the anode voltage;

a second diode, electrically coupled to the anode of the first thyristor, that rectifies a second portion of the anode voltage; and a third diode, electrically coupled to the anode of the first thyristor, that provides the first and second portions of the anode voltage to a voltage supply terminal and prevents reverse voltage from being applied to the anode of the first thyristor.

13. The thyristor circuit of claim 12, wherein the thyristor circuit is integrated in a single monolithic component.

14. The thyristor circuit of claim 12, further comprising:
a microcontroller, electrically coupled to the base of the second transistor, that provides the control signal; and
a voltage regulator, electrically coupled to the voltage supply terminal and the microcontroller, that receives the first and second portions of the anode voltage and provides a regulated voltage to the microcontroller.

15. The thyristor circuit of claim 12, wherein the thyristor circuit is monolithically integrated in a low-doped substrate of a first conductivity type, the thyristor circuit comprising:
a first region of a second conductivity type formed in a lower surface of the substrate;
an isolation wall of the second conductivity type contacting the first region and extending to an upper surface of the substrate to isolate a first portion of the substrate from a second portion of the substrate;
a second region of the second conductivity type formed in the upper surface of the first portion of the substrate;
a third region of the first conductivity type formed in the second region;
a fourth region of the second conductivity type formed adjacent to the second region in the upper surface of the first portion of the substrate and separated from the second region;
a fifth region of the first conductivity type formed in the fourth region;
sixth, seventh, and eighth regions of the second conductivity type formed adjacently in the upper surface of the second portion of the substrate and separated from each other;
a ninth region of the first conductivity type formed in the eighth region;
a first metallization layer contacting the lower surface of the substrate;
a second metallization layer contacting the third region;
a third metallization layer contacting the fourth region;
a fourth metallization layer contacting the fifth region;
a fifth metallization layer contacting the sixth region;
a sixth metallization layer contacting the seventh region;
a seventh metallization layer contacting the ninth region; and
an eighth metallization layer contacting the eighth region and the upper surface of the substrate.

16. The thyristor circuit of claim 15, further comprising a highly doped tenth region of the first conductivity type formed in the lower surface of the second portion of the substrate and contacting the first metallization layer.

17. The thyristor circuit of claim 9, further comprising:
a second thyristor having a gate, an anode, and a cathode that is electrically coupled to the cathode of the first thyristor; and
a third transistor having an emitter that is electrically coupled to the anode of the second thyristor, a collector that is electrically coupled to the gate of the second thyristor, and a base that is electrically coupled to the collector of the second transistor;
wherein the control signal turns on the second thyristor when an anode voltage of the second thyristor is greater than a cathode voltage of the second thyristor.

18. The thyristor circuit of claim 17, further comprising:
a resistor, connected between the emitter of the second transistor and the reference potential terminal, that electrically couples the emitter of the second transistor to the reference potential terminal.

19. The thyristor circuit of claim 18, wherein the first and third transistors are PNP transistors and the second transistor is an NPN transistor.

20. The thyristor circuit of claim 17, further comprising:
a first diode, electrically coupled between the anode of the first thyristor and a voltage supply terminal, that rectifies the anode voltage of the first thyristor; and
a second diode, electrically coupled between the anode of the second thyristor and the voltage supply terminal, that rectifies the anode voltage of the second thyristor.

21. The thyristor circuit of claim 20, wherein the thyristor circuit is integrated in a single monolithic component.

22. The thyristor circuit of claim 20, further comprising:
a microcontroller, electrically coupled to the base of the second transistor, that provides the control signal; and
a voltage regulator, electrically coupled to the voltage supply terminal and the microcontroller, that receives rectified anode voltages of the first and second thyristors and provides a regulated voltage to the microcontroller.

23. The thyristor circuit of claim 9, wherein the thyristor circuit is monolithically integrated in a low-doped substrate of a first conductivity type, the thyristor circuit comprising:
a first region of a second conductivity type formed in a lower surface of the substrate;
an isolation wall of the second conductivity type contacting the first region and extending to an upper surface of the substrate to isolate a first portion of the substrate;
a second region of the second conductivity type formed in the upper surface of the first portion of the substrate;
a third region of the first conductivity type formed in the second region;
a fourth region of the second conductivity type formed adjacent to the second region in the upper surface of the first portion of the substrate and separated from the second region;
a fifth region of the first conductivity type formed in the fourth region;
a first metallization layer contacting the lower surface of the substrate;
a second metallization layer contacting the third region;
a third metallization layer contacting the fourth region; and
a fourth metallization layer contacting the fifth region.

24. A thyristor circuit for charging a battery, comprising:
a first terminal to receive a first voltage;
a second terminal to connect to the battery having a second voltage;
a third terminal to receive a logic level control signal having an asserted voltage level;
a first thyristor having a gate, an anode, and a cathode, the anode being electrically coupled to the first terminal and the cathode being electrically coupled to the second terminal; and
means, electrically coupled to the third terminal and the anode and the gate of the first thyristor, for triggering the first thyristor in response to assertion of the control signal when the first voltage is greater than the second voltage independently of whether the asserted voltage level is greater than the second voltage.

25. The thyristor circuit of claim 24, wherein the means for triggering includes means for connecting the anode of the first thyristor to the gate of the first thyristor when the first voltage is greater than the second voltage independently of whether the asserted voltage level is greater than the second voltage.

26. The thyristor circuit of claim 24, wherein the means for triggering includes:
   a first transistor having a base, an emitter, and a collector, the emitter of the first transistor being electrically coupled to the anode of the first thyristor and the collector of the first transistor being electrically coupled to the gate of the first thyristor; and
   a second transistor having a base, an emitter, and a collector, the collector of the second transistor being electrically coupled to the bade of the first transistor, the emitter of the second transistor being electrically coupled through a resistor to a reference potential terminal, and the base being electrically coupled to the third terminal to receive the control signal.

27. The thyristor circuit of claim 26, wherein the first transistor is one of a PNP type transistor and a NPN type transistor and the second transistor is the other of the PNP type transistor and the NPN type transistor.

28. The thyristor circuit of claim 26, further comprising:
   a fourth terminal;
   first rectifying means, electrically coupled to the first terminal, for rectifying a first input signal and providing a first portion of the first voltage to the first terminal;
   second rectifying means, electrically coupled to the first terminal, for rectifying a second input signal and providing a second portion of the first voltage to the first terminal; and
   preventing means, electrically coupled to the first terminal, for providing the first voltage to the fourth terminal and preventing reverse voltage from being applied to the anode of the first thyristor.

29. The thyristor circuit of claim 28, further comprising:
   a microcontroller, electrically coupled to the third terminal, to provide the control signal to the third terminal; and
   a voltage regulator electrically coupled to the fourth terminal and the microcontroller to receive the first voltage from the fourth terminal and provide a regulated voltage to the microcontroller.

30. The thyristor circuit of claim 21, further comprising:
   a fourth terminal to receive a third voltage;
   a second thyristor having a gate, an anode, and a cathode, the anode of the second thyristor being electrically coupled to the fourth terminal, the cathode of the second thyristor being electrically coupled to the second terminal, and the means for triggering being electrically coupled to the anode and gate of the second thyristor; and
   wherein the means for triggering includes means, electrically coupled to the third terminal and the anode and the gate of the second thyristor, for triggering the second thyristor in response to the assertion of the control signal to charge the battery when the third voltage is greater than the second voltage independently of whether the asserted voltage level is greater than the second voltage.

31. The thyristor circuit of claim 30, further comprising:
   a fifth terminal;
   first rectifying means electrically coupled between the first terminal and the fifth terminal for rectifying the first voltage; and
   second rectifying means electrically coupled between the fourth terminal and the fifth terminal for rectifying the third voltage.

32. The thyristor circuit of claim 31, further comprising:
   a microcontroller, electrically coupled to the third terminal, to provide the control signal to the third terminal; and
   a voltage regulator electrically coupled to the fifth terminal and the microcontroller to provide a regulated voltage to the microcontroller.

33. A method of charging a battery, comprising the steps of:
   asserting a logic level control signal to an asserted voltage level;
   turning a first transistor on in response to assertion of the control signal;
   turning a second transistor on in response to the step of mining the first transistor on; and
   triggering a first thyristor when an anode voltage of the first thyristor is greater than a cathode voltage of the first thyristor independently of whether the asserted voltage level of the control signal is greater than the cathode voltage of the first thyristor.

34. The method of claim 33, wherein the step of triggering includes a step of: connecting an anode of the first thyristor to a gate of the first thyristor.

35. The method of claim 34, wherein the step of turning the second transistor on connects the anode of the first thyristor to the gate of the first thyristor.

36. The method of claim 33, further comprising a step of:
   rectifying a first input voltage and providing the rectified first input voltage to an anode of the first thyristor;
   rectifying a second input voltage and providing the rectified second input voltage to the anode of the first thyristor; and
   preventing reverse voltage from being applied to the anode of the first thyristor.

37. The method of claim 33, further comprising a step of:
   triggering a second thyristor when an anode voltage of the second thyristor is greater than a cathode voltage of the second thyristor independently of whether the asserted voltage level of the control signal is greater than the cathode voltage of the second thyristor.

38. The method of claim 37, wherein:
   the step of triggering the first thyristor includes a step of connecting an anode of the first thyristor to a gate of the first thyristor; and
   the step of triggering the second thyristor includes a step of connecting an anode of the first thyristor to a gate of the first thyristor.

39. The method of claim 37, further comprising a step of:
   rectifying the anode voltage of the first thyristor and providing the rectified anode voltage of the first thyristor to a rectified output terminal;
   rectifying the anode voltage of the second thyristor and providing the rectified anode voltage of the second thyristor to the rectified output terminal; and
   preventing reverse voltage from being applied to anodes of the first and second thyristors.

40. A circuit for controlling a thyristor with a logic level signal, comprising:
   a first switch having a first terminal that is electrically coupled to an anode of the thyristor, a second terminal that is electrically coupled to a gate of the thyristor, and a control terminal, the first switch having a conducting state that enables conduction in the thyristor and a non-conducting state that disables conduction in the thyristor; and a second switch having a first terminal that is electrically coupled to the control terminal of the first switch, a second terminal that is electrically coupled to a reference terminal, and a control terminal to receive the logic signal, the second switch having a conducting state that enables conduction in the thyristor when a voltage at the anode of the thyristor is greater than a voltage at a cathode of the thyristor and the logic level signal is asserted independently of the voltage at the cathode of the thyristor.

41. The circuit of claim 40, wherein the thyristor, the first switch, and the second switch are all integrated on a single monolithic integrated circuit.

42. The circuit of claim 40, wherein the first and second switches are bipolar transistors that are one of PNP type and NPN type, and the second switch opposite in type to the first switch.

43. The circuit of claim 40, wherein the second terminal of the second switch is electrically coupled to the reference terminal through a resistor that limits a current in the second switch when the second switch is in the conducting state.

* * * * *